United States Patent [19]

Nagayama et al.

[11] Patent Number: 5,614,044
[45] Date of Patent: Mar. 25, 1997

[54] METHOD OF MANUFACTURING A LAMINATED CERAMIC DEVICE

[75] Inventors: Hiroyuki Nagayama; Yoshihisa Ushida, both of Ichihara, Japan

[73] Assignee: Mitsui Petrochemical Industries, Ltd., Tokyo, Japan

[21] Appl. No.: 416,537

[22] Filed: Apr. 3, 1995

Related U.S. Application Data

[63] Continuation of Ser. No. 124,485, Sep. 22, 1993, abandoned, which is a continuation of Ser. No. 874,404, Apr. 27, 1992, abandoned, which is a division of Ser. No. 503,802, Apr. 3, 1990, abandoned.

[30] Foreign Application Priority Data

Apr. 7, 1989 [JP] Japan ........................ 1-89289
Apr. 7, 1989 [JP] Japan ........................ 1-89290

[51] Int. Cl.$^6$ .................................................. B32B 18/00
[52] U.S. Cl. ............................ 156/89; 29/25.35; 264/104
[58] Field of Search ................... 156/89, 290; 29/25.35; 310/328, 364–366, 311; 264/61, 104

[56] References Cited

U.S. PATENT DOCUMENTS

| | | | |
|---|---|---|---|
| 3,281,613 | 10/1966 | Hatschek | 310/366 |
| 4,591,627 | 5/1986 | Maruno et al. | 156/330 |
| 4,885,661 | 12/1989 | Yokotani et al. | 264/61 |
| 4,887,186 | 12/1989 | Takeda et al. | 264/61 |
| 4,978,881 | 12/1990 | Wakita et al. | 310/328 |
| 5,113,566 | 5/1992 | Weekamp et al. | 29/25.35 |

FOREIGN PATENT DOCUMENTS

| | | |
|---|---|---|
| 0094078 | 11/1983 | European Pat. Off. . |
| 0113999 | 7/1984 | European Pat. Off. . |
| 0190574 | 8/1986 | European Pat. Off. . |
| 0350941 | 1/1990 | European Pat. Off. . |

OTHER PUBLICATIONS

60–229380, Japan, Yokokawa Hokushin Denki, K.K., vol. 10, No. 82, (E–392) (2139), Apr. 2, 1986 (Application Abstract).
Patent Abstracts of Japan, vol. 8, No. 39, (E–228) 21 Feb. 1984—Abstract of Japanese Laid–Open Patent Publication No. 58–196069 (Nov. 15, 1983).
Patent Abstracts of Japan, vol. 8, No, 39 (E–228) 21 Feb. 1984—Abstract of Japanese Laid–Open Patent Publication No. 58–196070 (Nov. 15, 1983).
Patent Abstracts of Japan, vol. 10, No. 82 (E–392) 2 Apr. 1986—Abstract of Japanese Laid–Open Patent Publication No. 60–229380 (Nov. 14, 1985).

*Primary Examiner*—Jeffery R. Thurlow
*Attorney, Agent, or Firm*—Sherman and Shalloway

[57] ABSTRACT

Laminated ceramic devices useful as an actuator or other device responsive to electrostrictive effects or photoelectric effects are manufactured by a method which includes the steps of forming an internal electrode on each of a plurality of unbaked ceramic sheets. Each of the internal electrodes is provided with a notched area for defining a so-called future space. A plurality of the unbaked ceramic sheets is assembled to form a laminate whereby the notched areas defining the future spaces are alternately located on two different sides of the laminate with the alternate notched areas being vertically aligned. The assembled plurality of ceramic sheets is then fired and the internal electrodes baked to thereby definitively form spaces defined by the notched areas which define the so-called future or void spaces. The resulting formed spaces are thereby alternatively located on different sides of the laminate. The device is completed by connecting first and second groups of alternating internal electrodes with respective external electrodes arranged along the different sides opposite to the corresponding respective spaces. As a result, each of the external electrodes is separated from the group of alternating internal electrodes to which it is not electrically connected by the resulting corresponding spaces. As a result, the laminated ceramic device is not or is less subject to concentration of stress due to uneven distribution of strain caused by application of an electric field whereby the durability of the laminated ceramic device is improved.

8 Claims, 8 Drawing Sheets

METHOD OF MANUFACTURING A LAMINATED CERAMIC DEVICE

This application is a continuation of application Ser. No. 08/124,485, filed Sep. 22, 1993; which is a continuation of application Ser. No. 07/874,404, filed Apr. 27, 1992; which is a division of application Ser. No. 07/503,802, filed Apr. 3, 1990 both abandoned.

BACKGROUND OF THE INVENTION

This invention relates to a laminated ceramic device utilizing an electrostrictive effect and a method of manufacturing the same and more particularly it relates to a laminated ceramic device that can prevent concentration of stress due to unevenly distributed strain caused by application of an electric field and therefore is suitably used for an actuator or a similar application as well as to a method of manufacturing the same.

As is well known, a laminated ceramic device utilizing an electrostrictive effect is suitably used for an actuator or a similar application. FIGS. 7(A) and 7(B) of the accompanying drawings illustrate a typical laminated ceramic device designed as actuator.

In FIG. 7(A), it is shown that a laminated ceramic device generally indicated by reference numeral 2 comprises a number of ceramic sheets 4 arranged in so many layers with filmy internal electrodes 6a, 6b interposed therebetween. When viewed in cross section as in FIG. 7(A), the internal electrodes 6a, 6b are arranged obliquely relative to the two adjacent internal electrodes, a group consisting of every other electrodes 6a and the other group of electrodes 6b being respectively connected with corresponding external electrodes 8a, 8b. When a certain voltage is applied to the external electrodes 8a, 8b, a ceramic device 2 with such an arrangement of internal electrodes 6a, 6b and external electrodes 8a, 8b gives rise to an electric field in a direction perpendicular to the ceramic sheets 4 so that the ceramic device 2 is deformed in the directions of arrow A under the effect of the electric field and functions as an actuator.

In a laminated ceramic device 2 of this known type, those areas portion 10 of the layered ceramic sheets that are not intersected by internal electrodes 6a, 6b are inseparable from one another.

However, a laminated ceramic device 2 of this known type has a drawback of concentration of stress taking place at the boundary of portion 12, which exists between the internal electrodes 6a and 6b, and portion 10 which exists between only the internal electrodes 6a and 6a or 6b and 6b, because the portion 12 which exists between the internal electrodes 6a and 6b is strongly affected by the electric field generated by the applied voltage, whereas the portion 10 which exists between only the internal electrodes 6a and 6a, or 6b and 6b is weakly affected by the electric field. Such concentration of stress can significantly reduce the durability of the laminated ceramic device 2.

With a view to eliminating such a drawback, Japanese Patent Laid Open 58-196068 and 59-175176 propose a laminated ceramic device as illustrated in FIG. 8(A) and 8(B), wherein said laminated ceramic device 2a comprises filmy internal electrodes 6, each of which is interposed between two adjacent ceramic sheets 4 from end to end, insulation layers 14, each of which is arranged at an edge of every other internal electrode, and a pair of external electrodes 8a, 8b arranged at the two lateral sides of the device to cover the insulation layers. Since each of the internal electrodes 6 is so interposed between two adjacent ceramic sheets as to cover the whole surface areas thereof, all the ceramic sheets contained in the device 2a are evenly affected by an electric field applied thereto in the direction perpendicular to the sheets. Therefore a laminated ceramic device 2a comprising ceramic sheets 4 and having a configuration as illustrated in FIGS. 8(A) and 8(B) is free from concentration of stress that can take place in a device of FIGS. 7(A) and 7(B) and accordingly can expect an improved durability.

On the other hand, however, a laminated ceramic device 2a of FIGS. 8(A) and 8(B) requires a relatively complicated manufacturing process as each of the insulation layers 14 is arranged at an edge of every other internal electrode 6, making the process rather inefficient and consequently pushing up the manufacturing cost of the product. Moreover, if such a device has a defectively formed insulation layer in it, the two external electrodes 8a, 8b can be short-circuited to make the device inoperative.

SUMMARY OF THE INVENTION

In view of the above described problems, it is therefore the object of the present invention to provide a laminated ceramic device that can prevent concentration of stress due to unevenly distributed strain caused by an electric field and therefore is durable and suitably used for an actuator or a similar application as well as a method of manufacturing such devices in an industrially effective and efficient manner.

According to the invention, the above object is achieved by providing a laminated ceramic device comprising a plurality of ceramic sheets that can be subjected to electrostrictive force, a first and a second groups of filmy internal electrodes, the electrodes of said first and second groups being alternately arranged and interposed one by one between two adjacent ceramic sheets, a first external electrode connected to an edge of each of the internal electrodes of said first group and a second external electrode connected to an edge of each of the internal electrodes of said second group, wherein spaces are provided between said first external electrode and each of the internal electrodes of said second group and between said second external electrode and each of the internal electrodes of said first group respectively, so that the spaces are arranged between two adjacent ceramic sheets.

According to the invention, there is also provided a method of manufacturing laminated ceramic devices according to the invention comprising the steps of forming an internal electrode having a notched area on each of given number of unfired ceramic sheets made of an electrostrictively effective material as principal ingredient and a so-called future space defined by said notched area, assembling said plurality of unfired ceramic sheets to form a laminate in such a manner that said future spaces alternately faces two different lateral sides of the laminate, definitively forming spaces from said so-called future spaces by firing said assembled plurality of ceramic sheets and baking said internal electrodes and connecting two groups of every other internal electrodes with respective external electrodes arranged along lateral sides opposite to the corresponding respective spaces.

Alternatively, the internal electrode formed on an unfired ceramic sheet with a notched area located at an edge thereof may be juxtaposed with a block layer located within said notch so that so-called future space is formed between an edge of the internal electrode and the block layer, said future space becoming a definitive space between the internal electrode and the block layer after firing and baking.

Furthermore, it is possible that an internal electrode and a block layer are formed on unfired ceramic sheet, so that so-called future space is formed between an edge of the internal electrode and block layer.

An electrostrictive effect as used in the description of the present invention means an effect with which an object is strained when an electric field is applied thereto. More specifically, it means a piezoelectric voltage effect that generates a strain which is proportional to the applied voltage and/or an electrostrictive effect, in the strict sense of the words, is proportional to the square of the applied voltage.

Since a laminated ceramic device prepared by the manufacturing method according to the invention comprises spaces arranged along certain edges of the internal electrodes of the device and said spaces are devoid of any internal electrodes, every other internal electrodes can be connected to an external electrode without any difficulty if the spaces of those every other electrodes are arranged along a lateral edge of the device and those of the rest of the electrodes are arranged along another lateral edge of the device so that each of the external electrodes is separated from the unrelated internal electrodes by those corresponding spaces. Such spaces effectively serve to prevent concentration of stress due to uneven distribution of strain caused by application of an electric field and consequently to enhance the durability of the laminated device. Such a device is suitably used for an actuator.

Besides, the concept underlying the present invention can be used for prevention of any concentration of stress due to uneven distribution of strain caused by application of an electric field to a laminated ceramic device which is utilized not for its electrostrictive effect but for other effects including the photoelectric effect.

DETAILED DESCRIPTION OF THE INVENTION

Figure 1:
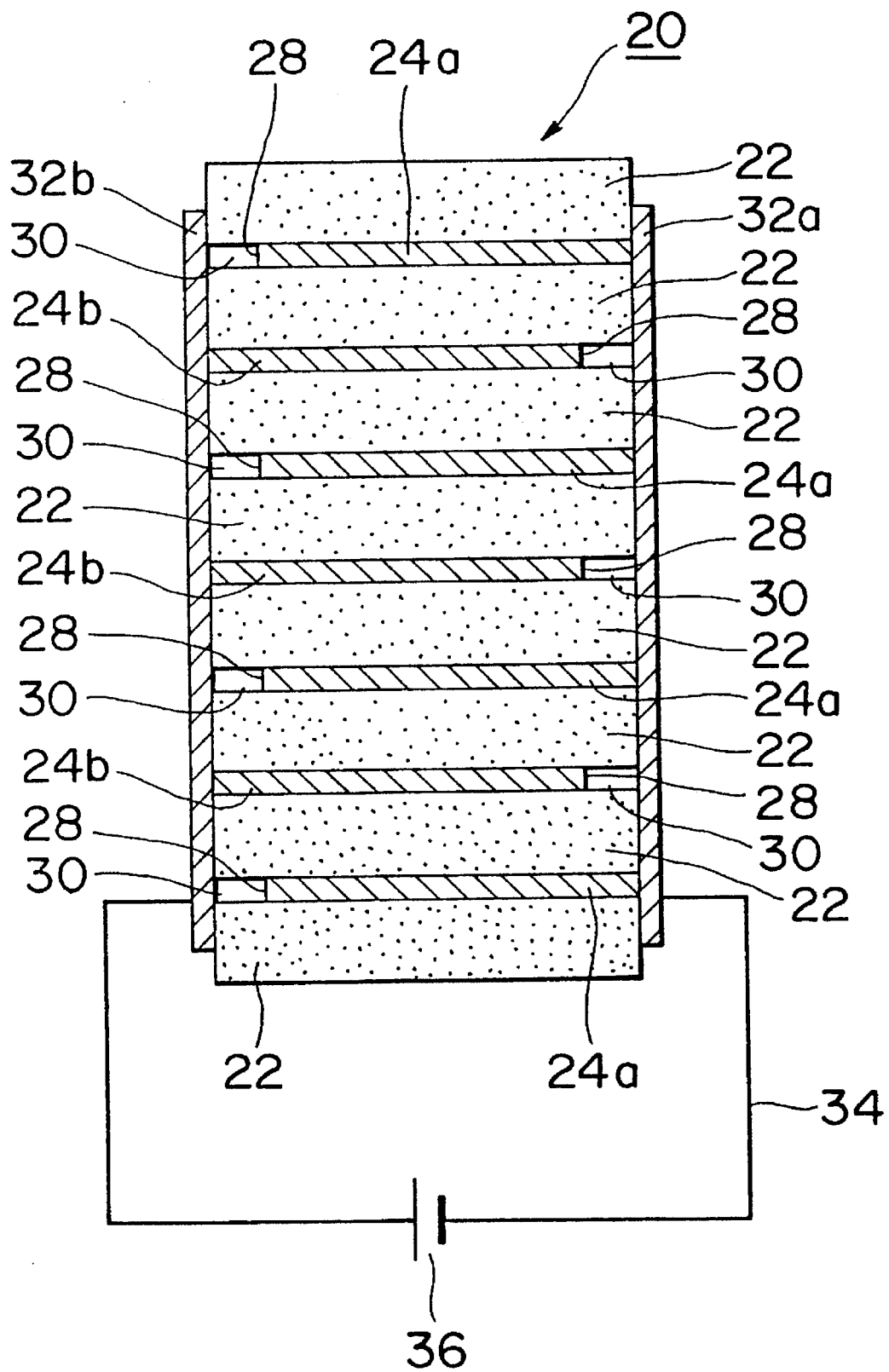
FIG. 1 is a longitudinal sectional view of a first preferred embodiment of the laminated ceramic device of the invention.

Firstly referring to FIG. 1, laminated ceramic device 20 is designed as an actuator to be used for an impact printer head or an X-Y table etc. Said ceramic device 20 comprises a number of electrostrictive ceramic sheets 22 arranged as so many layers and also a number of internal electrodes 24 (24a, 24b), each interposed between two adjacent ceramic sheets 22.

More specifically, said laminated ceramic device 20 comprises a plurality of electrostrictive ceramic sheets 22, a first and a second groups of filmy internal electrodes 24a, 24b, the electrodes of said first and second groups being alternately arranged and interposed one by one between two adjacent ceramic sheets 22, a first external electrode 32a connected to an edge of each of the internal electrodes 24a of said first group and a second external electrode 32b connected to an edge of each of the internal electrodes 24b of said second group, wherein spaces 30 are provided between said first external electrode 32a each of the internal electrodes 24b of said second group and between said second external electrode 32b and each of the internal electrodes 24a of said group. As result, the spaces 30 are arranged between two adjacent ceramic sheets 22.

In this embodiment, space 30 is defined by a notch 28 formed at an edge of each of the first and second internal electrodes 24a, 24b and the opposite surfaces of the ceramic sheets 22 that sandwich the electrode.

Figure 2:
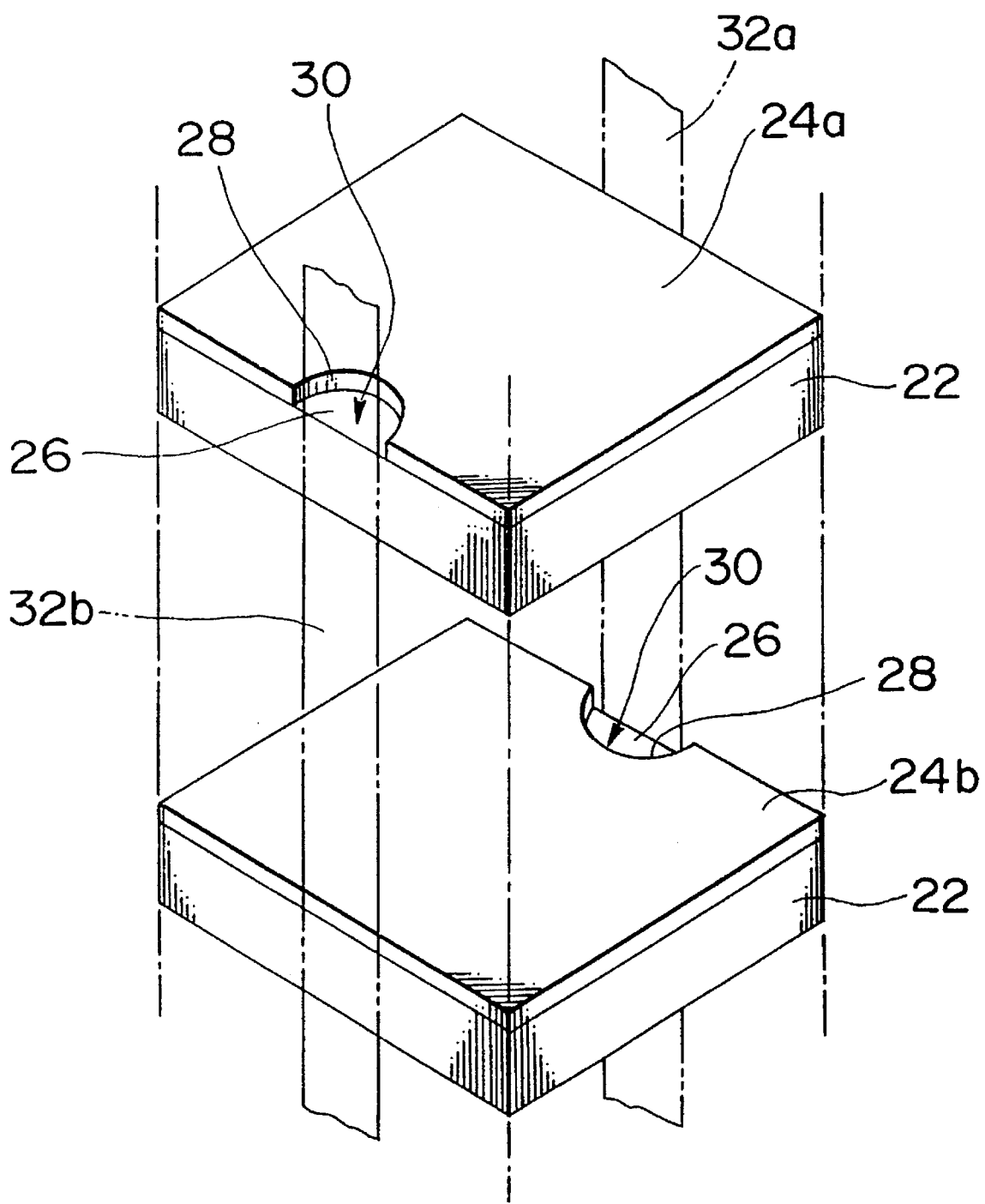
FIG. 2 is a perspective view of a ceramic sheet used in the embodiment of FIG. 1.

Each of the filmy internal electrode 24 (24a, 24b) is formed by applying paste of metal onto the surface of a ceramic sheet 22 as illustrated in FIG. 2. The metal to be used for the internal electrodes 24 (24a, 24b) may be, for example, platinum, palladium, silver-palladium alloy on silver. Since the ceramic sheet 22 are fired after lamination, the paste of metal may perferably be of a metal that can be baked at the firing temperature of the ceramic sheets. The paste of metal may contain powered zirconia, powered glass and/or calcined and powered ceramic which is chemically equivalent to electrostrictive ceramic sheets to be used for the purpose of the present invention in order to improve adhesion between the ceramic sheets 22 and he corresponding internal electodes 24 (24a, 24b) after firing.

When an internal electrode 24 (24a or 24b) is formed by applying paste of metal to the surface of a ceramic sheet 22, a portion of a peripheral edge thereof is covered with mask to provide a semicircular notch 28 or a future space 26 which is devoid of paste of metal as shown in FIG. 2. The notch 28 should not necessarily be semicircular and may be formed at a corner of the ceramic sheet 22 as illustrated at 128 to form opening 130 in FIG. 3.

The thickness of the internal electrodes 24 (24a, 24b) is preferably between 0.5 μm and 20 μm and more preferably between 1 μand 10 μm, although it should not by any means be limited by these values. Paste of metal may be applied by screen printing, roller printing or by means of any other appropriate technique.

The ceramic sheets 22 are made of materials that exhibit electrostrictive effects after firing and include as principal ingredients $PbTiO_3$, $PbZrO_3$, and Pb-based composite perovskite compound such as $Pb(Mg_{1/3}N_{2/3})O_3$ and $Pb(Ni_{1/3}N_{2/3})O_3$. Such ceramic sheets 22 may be prepared in the following manner prior to lamination and firing.

Firstly, if water is used as solvent, a binding agent such as hydroxyethylcellulose, methylcellulose, polyvinyl-alcohol or a wax-type slipping reagent and a plasticizer such as glycerol, polyalkylglycol, solbitonate, tri-ethyleneglycol, petriole or polyole are added to calcined and powdered ceramic that constitutes the principal ingredient and then mixed well to form a precursor mixture for molding. If, on the other hand, an organic solvent such as ethylalcohol, methylethylketone, benzene or toluene is used, a binder such as polymethylmethacrylate, polyvinyl-alcohol, polyvinylbutyral or celluloseacetate and a plasticizer such as dibutylphthalate, polyethyleneglycol or glycerol to calcined and powdered ceramic as described above and mixed well to prepare a precursor mixture for molding.

The precursor mixture is then molded to form a piece of ceramic having a desired thickness by using a doctor blade method or by extrusion molding or by means of any other appropriate technique. After it is dried, the molded piece is cut to desired longitudinal and lateral dimensions to become a raw ceramic sheet 22. The thickness of the raw ceramic sheet 22 is preferably between 0.02 μm and 2 μm and more preferably between 0.05 μm and 0.5 μm, although it should not by any means be limited by these values. Thereafter, an internal electrode 24 (24a or 24b) is formed on a surface of the raw ceramic sheet 22 by applying paste of metal.

A raw ceramic sheet 22 according to the invention may preferably be molded by using water as solvent and by extrusion molding, although other solvents and molding techniques may be also feasible as described earlier. If molded in the above described preferable manner, dried raw ceramic sheets show an excellent non-adhesiveness to one another with a reduced ratio of the binder and/or plasticizer contents. Moreover, the so-called future space 26 formed by a notch 28 on a raw ceramic sheet can be effectively used for formation of a space 30 after lamination and firing because the sheet does not adhere to the adjacent sheets at this area when it is laid between them. It should be noted that a desirable ceramic sheet 22 having a space 30 may also be adequately prepared by the combination of the use of an organic solvent and extrusion molding or the combination of the use of an organic solvent and that of a doctor blade.

The type and amount of the binder and/or plasticizer to be used and the drying condition under which raw ceramic sheets 22 are formed are so determined that the tensile-shearing-adhesive strength of each raw ceramic sheet 22 is preferably less than 10% and more preferably less than 5% of the tensile strength of the sheet proper when they are pressed together at temperature lower than 150° C. with pressure less than 200 kg/cm$^2$.

When raw ceramic sheets 22 are formed by using water for solvent and by extrusion molding, the ratio of the binder to be added to 100 weight portions of calcined powder is preferably between 1 and 10 weight portions and more preferably between 2 and 5 weight portions, while the ratio of plasticizer to be added to 100 weight portions of calcined powder is also preferably between 1 and 10 weight portions and more preferably between 2 and 5 weight portions.

Figure 3:
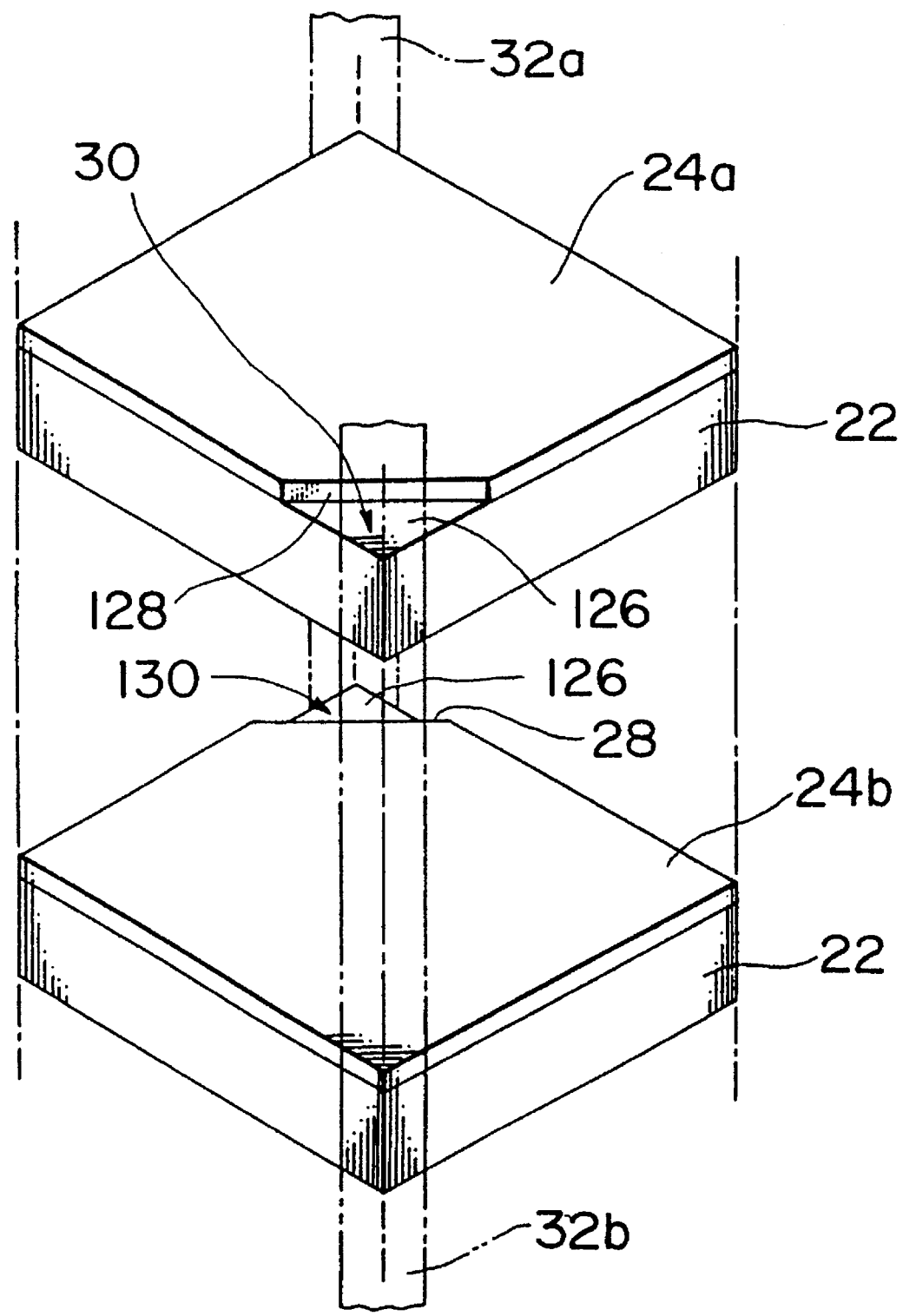
FIG. 3 is a perspective view of a variation of the ceramic sheet of FIG. 2.

Then an internal electrode 24 (24a or 24b) with a notch 28 to form a so-called future space 26 is formed on a side of each of the raw ceramic sheets 22 that have been molded, dried and cut to a given size. The notch 28 is formed by means of covering a portion of the surface of the raw ceramic sheet. Thereafter, the ceramic sheets, each having an internal electrode 24 (24a or 24b), are put together to form a laminate with their future spaces 26 so arranged that they alternately face opposite sides of the laminate as illustrated in FIG. 2. The laminate is then heat pressed, dewaxed and fired at predetermined temperature. As a result the internal electrodes 24 (24a, 24b) are firmly bonded to the corresponding sheets 22. The laminate may be cut to a given size prior to degreasing or alternatively it may be cut after firing. Moreover, the so-called future spaces 26 should not necessarily be so arranged that they alternately face opposite sides of the laminate. What is important here is that the ceramic sheets are so arranged that any two adjacent ones have their spaces at different locations and every other ceramic sheets has its space at a same vertical location. Two groups of spaces 126 of laminate as illustrated in FIG. 3 may be located at adjacent corners which are rotationally displaced by 90° from each other.

As a result, the internal electrodes of the first group 24a and those of the second group 24b are alternately arranged in the ceramic laminate.

When the laminate is fired at high temperature, any two adjacent ceramic sheets of the laminate come to have an unbonded area i.e. space 30 that corresponds to the so-called future space 26 formed by the rounded notch 28 of the internal electrode 24 between them.

Then, a first external electrode 32a and a second external electrode 32b are arranged on the fired laminate and connected respectively with all the first internal electrodes 24a and all the second internal electrode 24b to form a laminated ceramic device 20. Differently stated, in a laminated ceramic device 20 according to the invention, the external electrode 32a is connected with a group of internal electrodes 24a constituted by every other electrodes of the laminate having their spaces 30 at a same vertical location of the laminate, while the external electrode 32b is connected with another group of internal electrodes 24b constituted by the rest of the electrodes having their spaces 30 at another same vertical location of the laminate. The external electrodes 32a, 32b are preferably made of silver or solder but not limited thereto. These external electrodes 32a, 32b are preferably formed by applying paste of silver along two different lateral sides of the laminate and then baking the applied silver but the method of forming external electrodes is not necessarily limited to the above described one. It is desirable that the external electrodes 32a, 32b have a width smaller than that of the notches 28. If the width of the external electrodes 32a, 32b is greater than that of the notches 28, the external electrodes 32a, 32b can be short-circuited by way of any of the internal electrodes 24 (24a, 24b).

Figure 4:
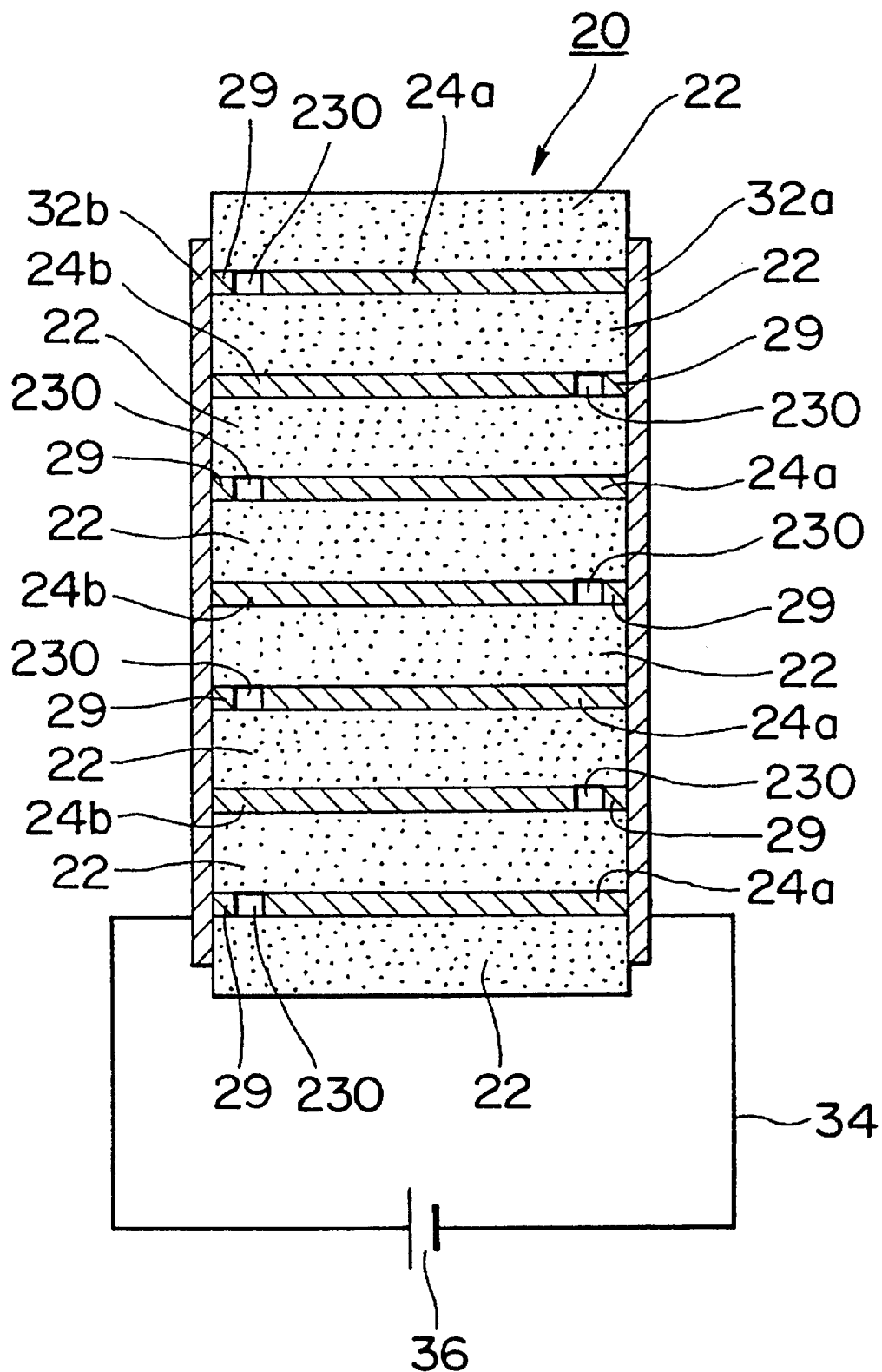
FIG. 4 is a longitudinal sectional view of a second embodiment of the laminated ceramic device of the invention.
Figure 5:
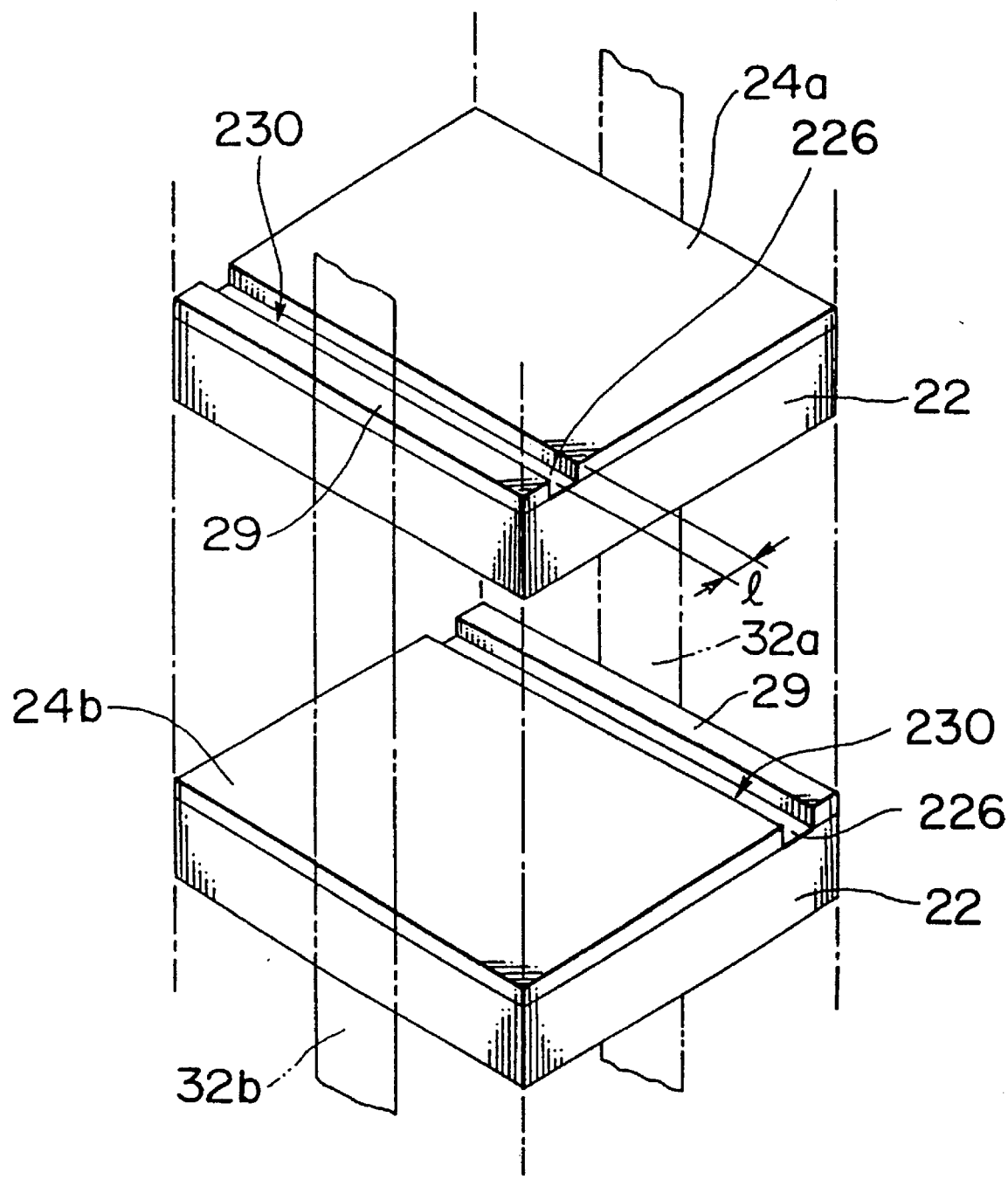
FIG. 5 is a perspective view of a ceramic sheet used in the embodiment of FIG. 4.
Figure 6:
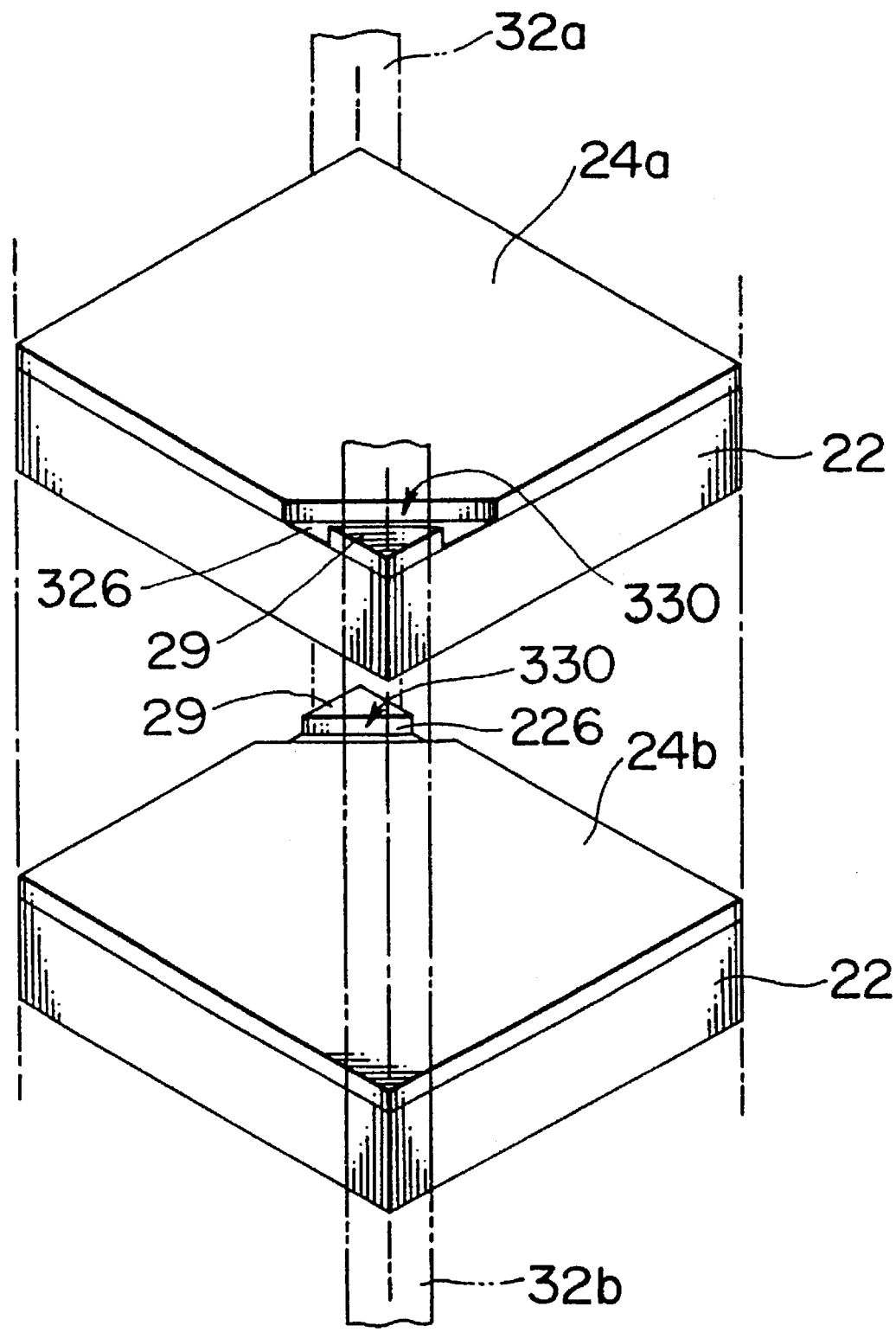
FIG. 6 is a perspective view of a variation of the ceramic sheet of FIG. 5, FIGS. 7(A) and (B) are respectively a longitudinal sectional view and a lateral sectional view of a conventional laminated ceramic device, and FIGS. 8(A) and (B) are respectively a longitudinal sectional view and a lateral sectional view of another conventional laminated ceramic device.

While a space 30 is formed at an edge or at a corner of each of the internal electrode 24 (24a, 24b) of a laminated ceramic device of the invention in FIGS. 1 through 3, such a space may be formed alternatively between an internal electrode 24 (24a or 24b) and a block 29 as illustrated in FIGS. 4 through 6.

In FIG. 5, a so-called future space 226 is formed along an edge of the internal electrode 24 (24a or 24b) formed by applying paste of metal to a ceramic sheet 22 as said future space 226 has a given width (1t,) and carries no paste of metal. Then a layer of an elongated block 29 is formed along the corresponding edge of the ceramic sheet 22 and juxtaposed with the internal electrode 24 (24a or 24b) in such a manner that they are separated from each other by clearance (l) on the ceramic sheet 22. The block layer 29 may be conveniently formed by applying paste of metal which is same as that used for formation of internal electrodes 24 (24a, 24b) but alternatively such a block layer 29 may be realized by using a different material such as a non-conductive material. When a block layer 29 is formed by applying paste of metal which is used for internal electrodes 24 (24a, 24b), it may be conveniently formed in a similar manner as the internal electrodes. It is desirable that the block layer 29 has a thickness which is same as that of the corresponding internal electrode 24 (24a or 24b).

While the block layer illustrated in FIG. 5 has an elongated shape, it may be differently configured and located as shown in FIG. 6 at 129 for example, to form future space 326 at space 330 where it is located at a corner, of a ceramic sheet 22 and has a triangular configuration. With such an arrangement, it will be clear that the internal electrode 24

(24a or 24b) and the block layer 129 are electrically insulated from each other.

Thereafter, the ceramic sheets, each carrying an internal electrode 24 (24a or 24b) and a block layer 29, or 129 are put together to form a laminate with their future spaces 226 so arranged that they are found alternately closed to opposite sides of the laminate as illustrated in FIG. 5 or FIG. 6. The laminate is then heat pressed, dewaxed and fired at predetermined temperature. As a result, the internal electrodes 24 (24a, 24b) are firmly bonded to the corresponding sheets 22. The laminate may be cut to a given size prior to degreasing or alternatively it may be cut after firing. Moreover, the block layers 29 should not necessarily be so arranged that they are found alternately close to opposite sides of the laminate. What is important here is that the ceramic sheets are so arranged that any two adjacent ones have their spaces at different locations and every other ceramic sheets has its space at a same vertical location. Two groups of spaces 326 of a laminate as illustrated in FIG. 6 may be located near adjacent corners which are rotationally displaced by 90° from each other.

Then, a first external electrode 32a and a second external electrode 32b are arranged along two different lateral sides of the laminate and connected respectively with all the first internal electrodes 24a and all the second internal electrode 24b to form a laminated ceramic device 20 it is recommended that the block layers 29 are also connected with the respective internal electrodes 24a, 24b and therefore with the respective external electrodes 32a, 32b. It is desirable that the external electrodes 32a, 32b have a width singlet than that of the block layers 29. If the width of the external electrodes 32a, 32b is greater than that of the block layers 29, the external electrodes 32a, 32b can be short-circuited by way of any of the internal electrodes 24 (24a, 24b).

When a voltage is applied to the external electrodes 32 of a laminated ceramic device 20 prepared in a manner as described above by way of a pair of leads 34, an electric field is generated along the longitudinal direction of the ceramic device 20, which accordingly deforms in the same direction to operate as an actuator.

As is apparent from the above description, according to the invention every other internal electrodes of a laminated ceramic device can be connected together with ease. Moreover, the spaces provided within the device effectively prevent concentration of stress due to uneven distribution of strain caused by application of an electric field so that the durability of the device can be improved. Such a laminated ceramic device can be suitably used for an actuator or other application. Besides, the concept underlying the present invention can be used for prevention of any concentration of stress due to uneven distribution of strain caused by application of an electric field to a laminated ceramic device which is utilized not for its electrostrictive effect but for other effects including the photoelectric effect.

EXAMPLES

Now the present invention will be described further by way of examples.

Example 1

A laminated ceramic device 20 having a configuration as described below was prepared. A number of ceramic sheets 22 having an electrostrictive effect were so arranged to form a laminate, in which they alternately carry a first group of filmy internal electrodes 24a and a second group of filmy internal electrodes 24b on one by one basis. Then a first external electrode 32a was formed on a lateral side of the laminate and connected with each of said first group of internal electrodes 24a and likewise a second external electrode 32b was formed on another lateral side of the laminate and connected with each of said second group of internal electrodes 24b. A space 30 was provided between said first external electrode 32a and each of said second internal electrodes 24b and between said second external electrode 32b and each of said first internal electrodes 24a. In other words, the space 30 was defined by a semicircular notch 28 formed at an edge of an internal electrode 24a or 24b and the opposite surfaces of the two adjacent ceramic sheets that sandwich the internal electrode.

It should be noted, however, that while the notch 28 has a semicircular shape in the above example, it may be differently shaped so long as there is formed an appropriate space defined by the notch 28 formed at an edge of an internal electrode 24a or 24b, and the opposite surfaces of the two adjacent ceramic sheets 22 that sandwich the internal electrode. Because of the provision of a notch 28 of an internal electrode, a space 30 is formed between two adjacent ceramic sheets 22 and consequently the internal electrode 24a or 24b and the juxtaposed external electrode 32b or 32a are physically and electrically insulated from each other.

A precursor material of the laminated ceramic device 20 of this example was prepared by adding a prescribed amount of methylcellulose as binder and also a prescribed amount of glycerol as plasticizer and water which was used as solvent to an amount of calcined powder of an electrostrictive material containing as principal ingredients $PbTiO_3$, $PbZrO_3$, $Pb(Mg_{1/3}Nb_{2/3})O_3$ and mixing well. Then, a given number of green sheets having a thickness of 120 μm were prepared from the precursor material by extrusion molding and the sheets were dried.

The sheets were then cut to a predetermined size and paste of silver-palladium was applied to a surface of each of the sheets by screen printing except for the area for the so-called semicircular future space 26 as illustrated in FIG. 2 in order to form an internal electrode 24 (24a or 24b). One hundred green sheets on which the paste had been applied were put together to form a laminate and heat pressed. For lamination, the green sheets were so arranged that the future spaces 26 alternately faced two adjacent lateral sides of the laminate. The obtained laminate was dewaxed at 500° C. and then fired at 1,100° C. The fired laminate was cut to produce individual devices.

When a section of the fired laminate was observed by means of a scanning type electronic microscope, each of the internal electrodes showed a thickness of 2 to 3 μm and a space with a height of also 2 to 3 μ was formed at each of the so-called future spaces 26.

Then a pair of external electrodes 32a, 32b were formed on each device by applying paste of silver respectively along its two different lateral sides as illustrated in FIG. 2 which were then baked so that they were electrically connected with the respective ends of the corresponding internal electrodes 24 (24a, 24b) located between two adjacent spaces 30. Then a lead was soldered to each of the external electrodes and the laminate were polarized by applying a DC voltage by way of the leads to produce a laminated ceramic device 20 as illustrated in FIG. 1.

The laminated ceramic device has dimensions of length× width×height=5 mm×5 mm×10 min. When subjected to a DC voltage of 100 V, it showed a deformation up to 11 μm.

After sinusoidal voltage pulses having a maximum voltage of 100 V with a frequency of 1 kHz had been continuously applied to the device for about 100,000,000 times to check the durability of the device, it did not show any reduction in the value of deformation nor any functional defects.

Example 2

As in the case of Example 1 above, a laminated ceramic device 20 having a configuration as described below was prepare as illustrated in FIG. 4 and 5. A number of ceramic sheets 22 having an electrostrictive effect were so arranged to form a laminate, in which they alternately carry a first group of filmy internal electrodes 24a and a second group of filmy internal electrodes 24b on one by one basis. Then a first external electrode 32a was formed on a lateral side of the laminate and connected with each of said first group of internal electrodes 24a and likewise a second external electrode 32b was formed on another lateral side of the laminate and connected with each of said second group of internal electrodes 24b.

A block layer 29 was provided between said first external electrode 32a and each of said second internal electrodes 24b and between said second external electrode 32b and each of said first internal electrodes 24a so that a space 30 was defined by the block layer 29, the juxtaposed internal electrode 24a or 24b and the opposite surfaces of the two adjacent ceramic sheets that sandwich the internal electrode 24a or 24b as well as the block layer 29.

The first and second external electrodes 32a, 32b were connected with the respective first and second groups of internal electrodes 24a, 24b comprising every other internal electrodes arranged in the laminated ceramic device. Therefore, said first external electrode 32a and each of said second internal electrodes 24b were physically and electrically insulated from each other by a space 30 and likewise said second external electrode 32b and each of said first internal electrodes 24a were physically and electrically insulated from each other by a space 230.

A precursor material of the laminated ceramic device 20 of this example was prepared by adding a prescribed amount of methylcellulose as binder and also a prescribed amount of glycerol. as plasticizer and water which was used as solvent to an amount of calcined powder of an electrostrictive material containing as principal ingredients $PbTiO_3$, $PbZrO_3$, $Pb(Mg_{1/3}Nb_{2/3})O_3$ and mixing well. Then, a given number of green sheets having a thickness of 120 μm were prepared frown the precursor material by extrusion molding and the sheets were dried.

The sheets were then cut to a predetermined size and paste of silver-palladium was applied to a surface of each of the sheets by screen printing except for the area for the so-called future space 226 having width (l) of 0.5 nun as illustrated in FIG. 5 in order to form an internal electrode 24 (24a or 24b) and a corresponding block layer 29 separated from each other by the so-called future space 226. One hundred green sheets on which the paste had been applied were put together to form a laminate and heat pressed. For lamination, the green sheets were so arranged that the block layers 29 alternately faced two adjacent lateral sides of the laminate. The obtained laminate was dewaxed at 500° C. and then fired at 1,100° C. The fired laminate was cut to produce individual devices.

When a section of the fired laminate was observed by means of a scanning type electronic microscope, each of the internal electrodes 24 (24a, 24b) and the corresponding block layer 29 showed a thickness of 2 to 3 μm and a space 230 with a height of also 2 to 3 μm was formed at each of the so-called future spaces 226 between the internal electrode 24 (24a or 24b) and the block layer 29.

Then a pair of external electrodes 32a, 32b were formed on each device by applying paste of silver respectively along its two different lateral sides as illustrated in FIG. 5 which were then baked so that they were electrically connected with the respective ends of the corresponding internal electrodes 24 (24a, 24b) located between two adjacent blocks 29. Then a lead was soldered to each of the external electrodes and the laminate were polarized by applying a DC voltage by way of the leads to produce a laminated ceramic device 20 as illustrated in FIG. 4.

The laminated ceramic device has dimensions of length× width×height=5 mm×5 mm×10 mm. When subjected to a DC voltage of 100 V, it showed a deformation up to 10 μm. After sinusoidal voltage pulse having a maximum voltage of 100 V with a frequency of 1 kHz had been successively applied to the device for approximately 100,000,000 times to check the durability of the device, it did not show any reduction in the value of deformation nor any functional defects.

Comparison Example

Figure 7A:
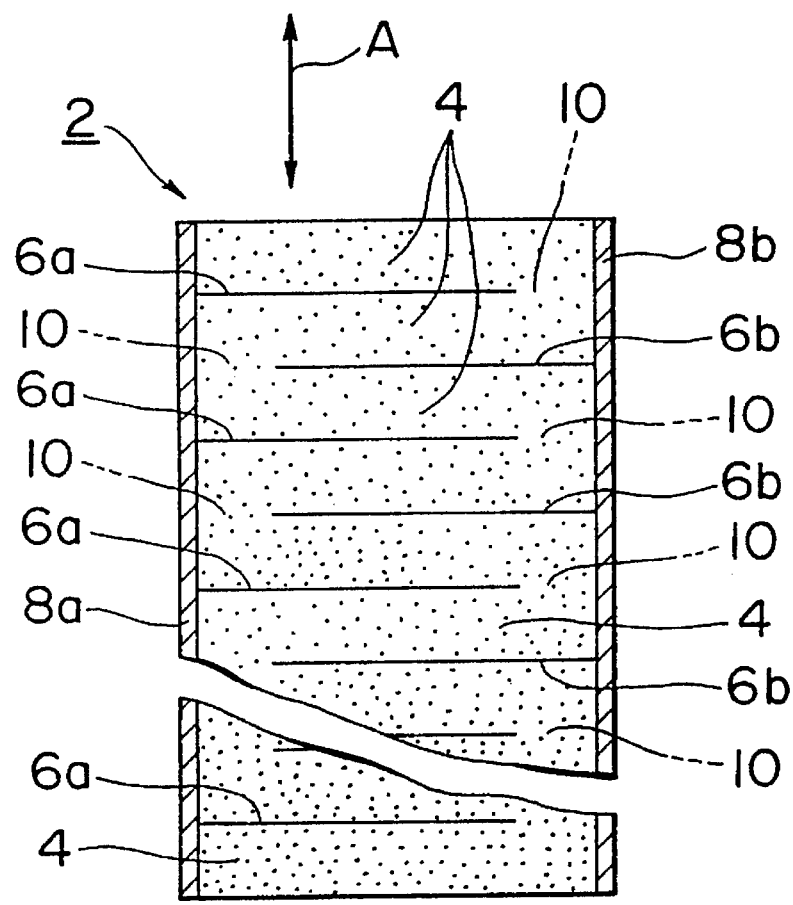
Figure 7B:
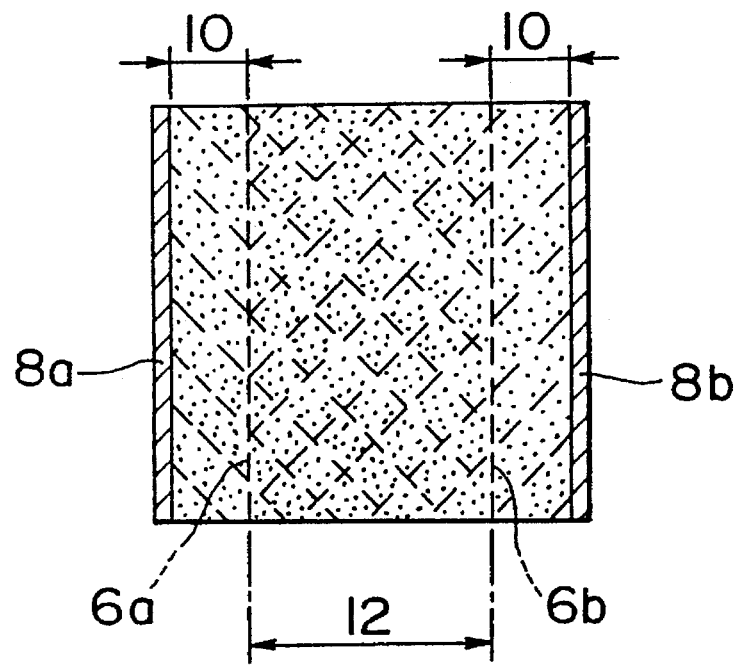

For the purpose of comparison, a laminated ceramic device of a conventional type as illustrated in FIG. 7 was prepared and subjected to the same durability test, in which voltage pulses were successively applied to the specimen for approximately 10,000 times. As a result of the test, the specimen was destructed.

Therefore, a laminated ceramic device according to the present invention can effectively prevent concentration of stress clue to uneven distribution of strain caused by application of an electric field because of the spaces provided at the edges of the internal electrodes and consequently has a remarkably improved durability as compared with a conventional laminated ceramic device illustrated in FIG. 7.

Figure 8A:
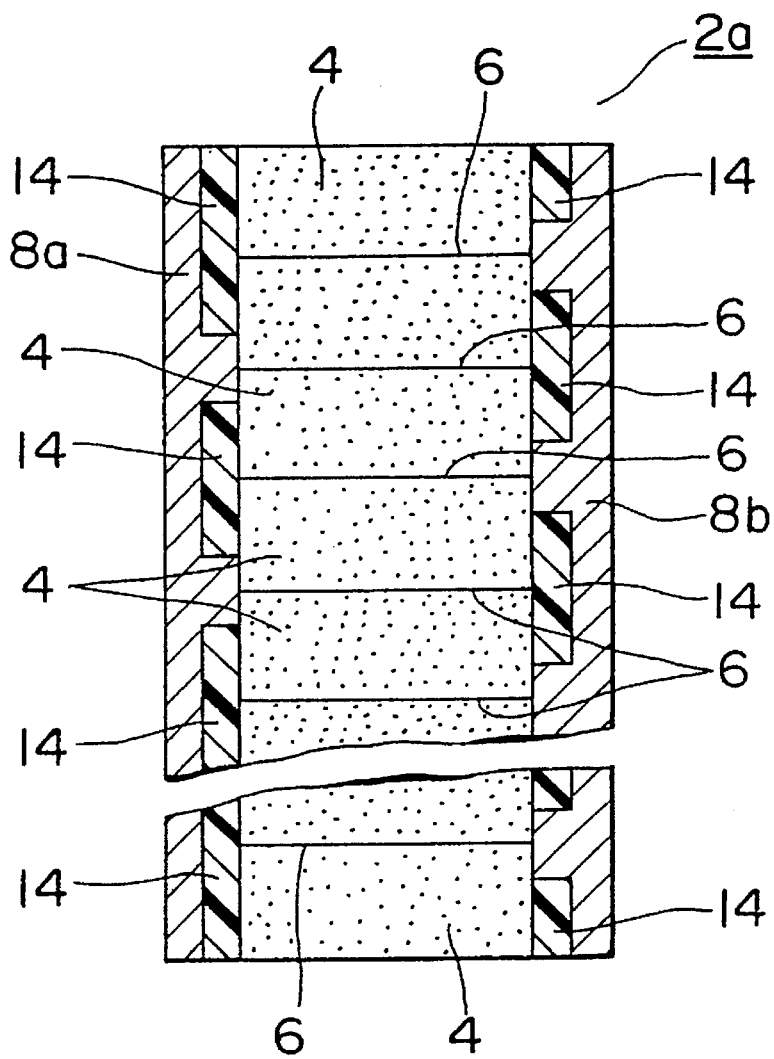
Figure 8B:
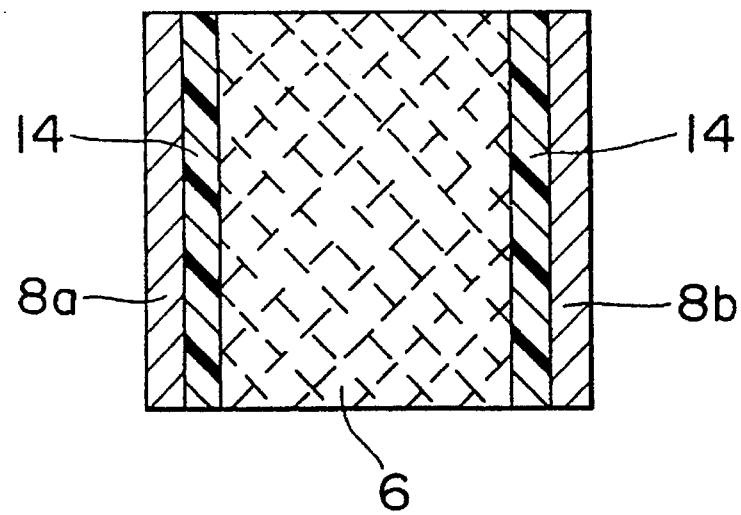

However, a laminated ceramic device according to the present invention can be prepared without requiring provision of insulation layers as that of a conventional laminated ceramic device illustrated in FIG. 8. Therefore, a laminated ceramic device according to the invention is free from any malfunctions due to defective insulation layers. Such laminated ceramic devices can be manufactured with a high yield by a relatively simple manner.

When the external electrode is formed by applying paste of metal, it is preferable that a laminated ceramic device according to the invention has block layers in the point of preventing the paste from blowing into the areas of internal electrodes.

What is claimed is:

1. A method of manufacturing a laminated ceramic device comprising the steps of:

forming an internal electrode on each of a plurality of unfired ceramic sheets made of an electrostrictive material as principal ingredient, each of said internal electrodes having a notched area;

assembling said plurality of unfired ceramic sheets to form a laminate in such a manner that each of said notched areas and said plurality of unfired ceramic sheets define void spaces which are alternately located on two different sides of the laminate;

firing said assembled plurality of ceramic sheets thereby definitively forming void spaces defined by said notched areas and said ceramic sheets and located on said two different sides of the laminate; and connecting two groups of every other internal electrode with respective external electrodes arranged along the two different sides of the laminate opposite to the void spaces;

wherein a block layer is formed within the area of each of said notched areas at the time of forming said internal electrodes so that a void space is definitively formed between an edge of said internal electrode and said block layer when the ceramic sheets are fired.

2. The method of manufacturing a laminated ceramic device according to claim 1, wherein said method further comprises a step of connecting said external electrodes respectively with a first group of every other block layers and a second group of the rest of the block layers.

3. A method of manufacturing a laminated ceramic device comprising the steps of:

forming an internal electrode and a block layer on each of a plurality of unfired ceramic sheets made of an electrostrictive material as principal ingredient so that a void space is formed between said unfired ceramic sheets, said block layer and an edge of said internal electrode;

assembling said plurality of unfired ceramic sheets to form a laminate in such a manner that said void spaces are alternately located on two different sides of the laminate;

firing said assembled plurality of unfired ceramic sheets; and connecting two groups of every other internal electrode with respective external electrodes arranged along the two different sides opposite to the void spaces.

4. The method of manufacturing a laminated ceramic device according to claim 3 wherein each block layer extends the entire length of a side of the ceramic sheet on which the block layer is formed.

5. The method of claim 3 wherein the block layer and associated space formed on each ceramic sheet are located at a corner of the ceramic sheet.

6. The method of claim 3 wherein the block layer is formed from a non-conductive material.

7. The method of claim 1 wherein the block layer is formed from a non-conductive material.

8. A method of manufacturing a laminated ceramic device comprising the steps of:

forming an internal electrode on each of a plurality of unfired ceramic sheets made of an electrostrictive material as principal ingredient, each of said internal electrodes having a notched area;

assembling said plurality of unfired ceramic sheets to form a laminate in such a manner that each of said notched areas and said plurality of unfired ceramic sheets define void spaces which are alternately located on two different sides of the laminate;

heat pressing said assembled plurality of unfired ceramic sheets by pressing said assembled plurality of unfired ceramic sheets together at a pressure of less than 200 kg/cm$^2$ while heating said assembled plurality of unfired ceramic sheets at a temperature lower than 150° C., a tensile-shearing-adhesive strength between two such heat pressed, unfired ceramic sheets being less than 10% of a tensile strength of such an unfired ceramic sheet;

firing said heat pressed, assembled plurality of unfired ceramic sheets thereby definitively forming void spaces defined by said notched areas and said fired ceramic sheets and located on two different sides of the laminate; and connecting two groups of every other internal electrode with respective external electrodes arranged along the two different sides of the laminate opposite to the void spaces.

* * * * *